US009542968B1

United States Patent
Yuan et al.

(10) Patent No.: US 9,542,968 B1
(45) Date of Patent: Jan. 10, 2017

(54) SINGLE LAYER SMALL GRAIN SIZE FEPT:C FILM FOR HEAT ASSISTED MAGNETIC RECORDING MEDIA

(71) Applicant: WD Media, LLC, San Jose, CA (US)

(72) Inventors: Hua Yuan, Fremont, CA (US); Alexander S. Chernyshov, San Jose, CA (US); B. Ramamurthy Acharya, Fremont, CA (US)

(73) Assignee: WD MEDIA, LLC, San Jose, CA (US)

( * ) Notice: Subject to any disclaimer, the term of this patent is extended or adjusted under 35 U.S.C. 154(b) by 229 days.

(21) Appl. No.: 14/069,075

(22) Filed: Oct. 31, 2013

Related U.S. Application Data

(62) Division of application No. 12/860,616, filed on Aug. 20, 2010, now Pat. No. 8,889,275.

(51) Int. Cl.
| | |
|---|---|
| *C23C 14/00* | (2006.01) |
| *C23C 14/32* | (2006.01) |
| *G11B 5/851* | (2006.01) |
| *C23C 14/14* | (2006.01) |
| *G11B 5/84* | (2006.01) |
| *C23C 14/35* | (2006.01) |
| *C23C 14/34* | (2006.01) |

(52) U.S. Cl.
CPC ............. *G11B 5/851* (2013.01); *C23C 14/14* (2013.01); *C23C 14/3407* (2013.01); *C23C 14/35* (2013.01); *G11B 5/84* (2013.01)

(58) Field of Classification Search
CPC ............................. C23C 14/3407; C23C 14/35
See application file for complete search history.

(56) References Cited

U.S. PATENT DOCUMENTS

| | | | |
|---|---|---|---|
| 5,603,766 A | 2/1997 | Visokay et al. |
| 5,824,409 A | 10/1998 | Sellmyer et al. |
| 6,007,623 A | 12/1999 | Thiele et al. |
| 6,013,161 A | 1/2000 | Chen et al. |
| 6,063,248 A | 5/2000 | Bourez et al. |
| 6,068,891 A | 5/2000 | O'Dell et al. |
| 6,086,730 A | 7/2000 | Liu et al. |
| 6,086,974 A | 7/2000 | Thiele et al. |
| 6,099,981 A | 8/2000 | Nishimori |
| 6,103,404 A | 8/2000 | Ross et al. |
| 6,117,499 A | 9/2000 | Wong et al. |

(Continued)

FOREIGN PATENT DOCUMENTS

WO    WO2008030199    3/2008

OTHER PUBLICATIONS

FePt—C graded media for ultra-high density magnetic recording J S Chen et al Apr. 2010 J. Phys. D: Appl. Phys. 43 185001.*

(Continued)

*Primary Examiner* — Ibrahime A Abraham
(74) *Attorney, Agent, or Firm* — Sheppard Mullin Richter & Hampton LLP

(57) ABSTRACT

FePt-based heat assisted magnetic recording (HAMR) media comprising a thick granular FePt:C magnetic recording layer capable of maintaining a single layer film having desirable magnetic properties. According to one embodiment, the thick granular FePt:C magnetic recording layer comprises a plurality of carbon doped FePt alloy columnar grains, where the plurality of carbon doped FePt alloy columnar grains comprise a carbon gradient along the thickness of the hard magnetic recording layer.

11 Claims, 9 Drawing Sheets

(56) References Cited

U.S. PATENT DOCUMENTS

| | | |
|---|---|---|
| 6,136,403 A | 10/2000 | Prabhakara et al. |
| 6,139,907 A | 10/2000 | Sellmyer et al. |
| 6,143,375 A | 11/2000 | Ross et al. |
| 6,145,849 A | 11/2000 | Bae et al. |
| 6,146,737 A | 11/2000 | Malhotra et al. |
| 6,149,696 A | 11/2000 | Jia |
| 6,150,015 A | 11/2000 | Bertero et al. |
| 6,156,404 A | 12/2000 | Ross et al. |
| 6,159,076 A | 12/2000 | Sun et al. |
| 6,164,118 A | 12/2000 | Suzuki et al. |
| 6,183,606 B1 | 2/2001 | Kuo et al. |
| 6,183,893 B1 | 2/2001 | Futamoto et al. |
| 6,200,441 B1 | 3/2001 | Gornicki et al. |
| 6,204,995 B1 | 3/2001 | Hokkyo et al. |
| 6,206,765 B1 | 3/2001 | Sanders et al. |
| 6,210,819 B1 | 4/2001 | Lal et al. |
| 6,216,709 B1 | 4/2001 | Fung et al. |
| 6,221,119 B1 | 4/2001 | Homola |
| 6,248,395 B1 | 6/2001 | Homola et al. |
| 6,261,681 B1 | 7/2001 | Suekane et al. |
| 6,270,885 B1 | 8/2001 | Hokkyo et al. |
| 6,274,063 B1 | 8/2001 | Li et al. |
| 6,283,838 B1 | 9/2001 | Blake et al. |
| 6,287,429 B1 | 9/2001 | Moroishi et al. |
| 6,290,573 B1 | 9/2001 | Suzuki |
| 6,299,947 B1 | 10/2001 | Suzuki et al. |
| 6,303,217 B1 | 10/2001 | Malhotra et al. |
| 6,309,765 B1 | 10/2001 | Suekane et al. |
| 6,358,636 B1 | 3/2002 | Yang et al. |
| 6,362,452 B1 | 3/2002 | Suzuki et al. |
| 6,363,599 B1 | 4/2002 | Bajorek |
| 6,365,012 B1 | 4/2002 | Sato et al. |
| 6,381,090 B1 | 4/2002 | Suzuki et al. |
| 6,381,092 B1 | 4/2002 | Suzuki |
| 6,387,483 B1 | 5/2002 | Hokkyo et al. |
| 6,391,213 B1 | 5/2002 | Homola |
| 6,395,349 B1 | 5/2002 | Salamon |
| 6,403,919 B1 | 6/2002 | Salamon |
| 6,408,677 B1 | 6/2002 | Suzuki |
| 6,426,157 B1 | 7/2002 | Hokkyo et al. |
| 6,429,984 B1 | 8/2002 | Alex |
| 6,482,330 B1 | 11/2002 | Bajorek |
| 6,482,505 B1 | 11/2002 | Bertero et al. |
| 6,500,567 B1 | 12/2002 | Bertero et al. |
| 6,528,124 B1 | 3/2003 | Nguyen |
| 6,548,821 B1 | 4/2003 | Treves et al. |
| 6,552,871 B2 | 4/2003 | Suzuki et al. |
| 6,565,719 B1 | 5/2003 | Lairson et al. |
| 6,566,674 B1 | 5/2003 | Treves et al. |
| 6,571,806 B2 | 6/2003 | Rosano et al. |
| 6,599,646 B2 | 7/2003 | Suzuki et al. |
| 6,628,466 B2 | 9/2003 | Alex |
| 6,664,503 B1 | 12/2003 | Hsieh et al. |
| 6,670,055 B2 | 12/2003 | Tomiyasu et al. |
| 6,682,807 B2 | 1/2004 | Lairson et al. |
| 6,683,754 B2 | 1/2004 | Suzuki et al. |
| 6,716,516 B2 | 4/2004 | Futamoto et al. |
| 6,730,420 B1 | 5/2004 | Bertero et al. |
| 6,743,528 B2 | 6/2004 | Suekane et al. |
| 6,759,138 B2 | 7/2004 | Tomiyasu et al. |
| 6,778,353 B1 | 8/2004 | Harper |
| 6,795,274 B1 | 9/2004 | Hsieh et al. |
| 6,824,817 B2 | 11/2004 | Araki et al. |
| 6,846,583 B2 | 1/2005 | Inaba et al. |
| 6,855,232 B2 | 2/2005 | Jairson et al. |
| 6,857,937 B2 | 2/2005 | Bajorek |
| 6,893,748 B2 | 5/2005 | Bertero et al. |
| 6,899,959 B2 | 5/2005 | Bertero et al. |
| 6,916,558 B2 | 7/2005 | Umezawa et al. |
| 6,939,120 B1 | 9/2005 | Harper |
| 6,946,191 B2 | 9/2005 | Morikawa et al. |
| 6,967,798 B2 | 11/2005 | Homola et al. |
| 6,972,135 B2 | 12/2005 | Homola |
| 7,004,827 B1 | 2/2006 | Suzuki et al. |
| 7,006,323 B1 | 2/2006 | Suzuki |
| 7,016,154 B2 | 3/2006 | Nishihira |
| 7,019,924 B2 | 3/2006 | McNeil et al. |
| 7,045,215 B2 | 5/2006 | Shimokawa |
| 7,070,870 B2 | 7/2006 | Bertero et al. |
| 7,090,934 B2 | 8/2006 | Hokkyo et al. |
| 7,099,112 B1 | 8/2006 | Harper |
| 7,105,241 B2 | 9/2006 | Shimokawa et al. |
| 7,119,990 B2 | 10/2006 | Bajorek et al. |
| 7,147,790 B2 | 12/2006 | Wachenschwanz et al. |
| 7,161,753 B2 | 1/2007 | Wachenschwanz et al. |
| 7,166,319 B2 | 1/2007 | Ishiyama |
| 7,166,374 B2 | 1/2007 | Suekane et al. |
| 7,169,487 B2 | 1/2007 | Kawai et al. |
| 7,174,775 B2 | 2/2007 | Ishiyama |
| 7,179,549 B2 | 2/2007 | Malhotra et al. |
| 7,184,139 B2 | 2/2007 | Treves et al. |
| 7,196,860 B2 | 3/2007 | Alex |
| 7,199,977 B2 | 4/2007 | Suzuki et al. |
| 7,208,236 B2 | 4/2007 | Morikawa et al. |
| 7,220,500 B1 | 5/2007 | Tomiyasu et al. |
| 7,229,266 B2 | 6/2007 | Harper |
| 7,239,970 B2 | 7/2007 | Treves et al. |
| 7,241,520 B2 | 7/2007 | Shin et al. |
| 7,252,897 B2 | 8/2007 | Shimokawa et al. |
| 7,277,254 B2 | 10/2007 | Shimokawa et al. |
| 7,281,920 B2 | 10/2007 | Homola et al. |
| 7,282,278 B1 | 10/2007 | Nolan |
| 7,286,324 B2 | 10/2007 | Yasui et al. |
| 7,292,329 B2 | 11/2007 | Treves et al. |
| 7,301,726 B1 | 11/2007 | Suzuki |
| 7,302,148 B2 | 11/2007 | Treves et al. |
| 7,305,119 B2 | 12/2007 | Treves et al. |
| 7,314,404 B2 | 1/2008 | Singh et al. |
| 7,320,584 B1 | 1/2008 | Harper et al. |
| 7,329,114 B2 | 2/2008 | Harper et al. |
| 7,375,362 B2 | 5/2008 | Treves et al. |
| 7,420,886 B2 | 9/2008 | Tomiyasu et al. |
| 7,425,719 B2 | 9/2008 | Treves et al. |
| 7,471,484 B2 | 12/2008 | Wachenschwanz et al. |
| 7,498,062 B2 | 3/2009 | Calcaterra et al. |
| 7,531,485 B2 | 5/2009 | Hara et al. |
| 7,537,846 B2 | 5/2009 | Ishiyama et al. |
| 7,549,209 B2 | 6/2009 | Wachenschwanz et al. |
| 7,569,490 B2 | 8/2009 | Staud |
| 7,597,792 B2 | 10/2009 | Homola et al. |
| 7,597,973 B2 | 10/2009 | Ishiyama |
| 7,608,193 B2 | 10/2009 | Wachenschwanz et al. |
| 7,632,087 B2 | 12/2009 | Homola |
| 7,656,615 B2 | 2/2010 | Wachenschwanz et al. |
| 7,682,546 B2 | 3/2010 | Harper |
| 7,684,152 B2 | 3/2010 | Suzuki et al. |
| 7,686,606 B2 | 3/2010 | Harper et al. |
| 7,686,991 B2 | 3/2010 | Harper |
| 7,695,833 B2 | 4/2010 | Ishiyama |
| 7,722,968 B2 | 5/2010 | Ishiyama |
| 7,733,605 B2 | 6/2010 | Suzuki et al. |
| 7,736,768 B2 | 6/2010 | Ishiyama |
| 7,755,861 B1 | 7/2010 | Li et al. |
| 7,758,732 B1 | 7/2010 | Calcaterra et al. |
| 7,833,639 B2 | 11/2010 | Sonobe et al. |
| 7,833,641 B2 | 11/2010 | Tomiyasu et al. |
| 7,910,159 B2 | 3/2011 | Jung |
| 7,911,736 B2 | 3/2011 | Bajorek |
| 7,924,519 B2 | 4/2011 | Lambert |
| 7,944,165 B1 | 5/2011 | O'Dell |
| 7,944,643 B1 | 5/2011 | Jiang et al. |
| 7,955,723 B2 | 6/2011 | Umezawa et al. |
| 7,983,003 B2 | 7/2011 | Sonobe et al. |
| 7,993,497 B2 | 8/2011 | Moroishi et al. |
| 7,993,765 B2 | 8/2011 | Kim et al. |
| 7,998,912 B2 | 8/2011 | Chen et al. |
| 8,002,901 B1 | 8/2011 | Chen et al. |
| 8,003,237 B2 | 8/2011 | Sonobe et al. |
| 8,012,920 B2 | 9/2011 | Shimokawa |
| 8,038,863 B2 | 10/2011 | Homola |
| 8,057,926 B2 | 11/2011 | Ayama et al. |
| 8,062,778 B2 | 11/2011 | Suzuki et al. |
| 8,064,156 B1 | 11/2011 | Suzuki et al. |
| 8,076,013 B2 | 12/2011 | Sonobe et al. |

(56) References Cited

U.S. PATENT DOCUMENTS

| | | |
|---|---|---|
| 8,092,931 B2 | 1/2012 | Ishiyama et al. |
| 8,100,685 B1 | 1/2012 | Harper et al. |
| 8,101,054 B2 | 1/2012 | Chen et al. |
| 8,125,723 B1 | 2/2012 | Nichols et al. |
| 8,125,724 B1 | 2/2012 | Nichols et al. |
| 8,137,517 B1 | 3/2012 | Bourez |
| 8,142,916 B2 | 3/2012 | Umezawa et al. |
| 8,163,093 B1 | 4/2012 | Chen et al. |
| 8,171,949 B1 | 5/2012 | Lund et al. |
| 8,173,282 B1 | 5/2012 | Sun et al. |
| 8,178,480 B2 | 5/2012 | Hamakubo et al. |
| 8,206,789 B2 | 6/2012 | Suzuki |
| 8,218,260 B2 | 7/2012 | Iamratanakul et al. |
| 8,247,095 B2 | 8/2012 | Champion et al. |
| 8,257,783 B2 | 9/2012 | Suzuki et al. |
| 8,268,462 B2 | 9/2012 | Peng et al. |
| 8,298,609 B1 | 10/2012 | Liew et al. |
| 8,298,689 B2 | 10/2012 | Sonobe et al. |
| 8,309,239 B2 | 11/2012 | Umezawa et al. |
| 8,316,668 B1 | 11/2012 | Chan et al. |
| 8,331,056 B2 | 12/2012 | O'Dell |
| 8,354,618 B1 | 1/2013 | Chen et al. |
| 8,367,228 B2 | 2/2013 | Sonobe et al. |
| 8,383,209 B2 | 2/2013 | Ayama |
| 8,394,243 B1 | 3/2013 | Jung et al. |
| 8,397,751 B1 | 3/2013 | Chan et al. |
| 8,399,809 B1 | 3/2013 | Bourez |
| 8,402,638 B1 | 3/2013 | Treves et al. |
| 8,404,056 B1 | 3/2013 | Chen et al. |
| 8,404,369 B2 | 3/2013 | Ruffini et al. |
| 8,404,370 B2 | 3/2013 | Sato et al. |
| 8,406,918 B2 | 3/2013 | Tan et al. |
| 8,414,966 B2 | 4/2013 | Yasumori et al. |
| 8,425,975 B2 | 4/2013 | Ishiyama |
| 8,431,257 B2 | 4/2013 | Kim et al. |
| 8,431,258 B2 | 4/2013 | Onoue et al. |
| 8,453,315 B2 | 6/2013 | Kajiwara et al. |
| 8,488,276 B1 | 7/2013 | Jung et al. |
| 8,491,800 B1 | 7/2013 | Dorsey |
| 8,492,009 B1 | 7/2013 | Homola et al. |
| 8,492,011 B2 | 7/2013 | Itoh et al. |
| 8,496,466 B1 | 7/2013 | Treves et al. |
| 8,517,364 B1 | 8/2013 | Crumley et al. |
| 8,517,657 B2 | 8/2013 | Chen et al. |
| 8,524,052 B1 | 9/2013 | Tan et al. |
| 8,530,065 B1 | 9/2013 | Chernyshov et al. |
| 8,546,000 B2 | 10/2013 | Umezawa |
| 8,551,253 B2 | 10/2013 | Na'im et al. |
| 8,551,627 B2 | 10/2013 | Shimada et al. |
| 8,556,566 B1 | 10/2013 | Suzuki et al. |
| 8,559,131 B2 | 10/2013 | Masuda et al. |
| 8,562,748 B1 | 10/2013 | Chen et al. |
| 8,565,050 B1 | 10/2013 | Bertero et al. |
| 8,570,844 B1 | 10/2013 | Yuan et al. |
| 8,580,410 B2 | 11/2013 | Onoue |
| 8,584,687 B1 | 11/2013 | Chen et al. |
| 8,591,709 B1 | 11/2013 | Lim et al. |
| 8,592,061 B2 | 11/2013 | Onoue et al. |
| 8,596,287 B1 | 12/2013 | Chen et al. |
| 8,597,723 B1 | 12/2013 | Jung et al. |
| 8,603,649 B2 | 12/2013 | Onoue |
| 8,603,650 B2 | 12/2013 | Sonobe et al. |
| 8,605,388 B2 | 12/2013 | Yasumori et al. |
| 8,605,555 B1 | 12/2013 | Chernyshov et al. |
| 8,608,147 B1 | 12/2013 | Yap et al. |
| 8,609,263 B1 | 12/2013 | Chernyshov et al. |
| 8,619,381 B2 | 12/2013 | Moser et al. |
| 8,623,528 B2 | 1/2014 | Umezawa et al. |
| 8,623,529 B2 | 1/2014 | Suzuki |
| 8,634,155 B2 | 1/2014 | Yasumori et al. |
| 8,658,003 B1 | 2/2014 | Bourez |
| 8,658,292 B1 | 2/2014 | Mallary et al. |
| 8,665,541 B2 | 3/2014 | Saito |
| 8,668,953 B1 | 3/2014 | Buechel-Rimmel |
| 8,674,327 B1 | 3/2014 | Poon et al. |
| 8,685,214 B1 | 4/2014 | Moh et al. |
| 8,696,404 B2 | 4/2014 | Sun et al. |
| 8,711,499 B1 | 4/2014 | Desai et al. |
| 8,743,666 B1 | 6/2014 | Bertero et al. |
| 8,758,912 B2 | 6/2014 | Srinivasan et al. |
| 8,787,124 B1 | 7/2014 | Chernyshov et al. |
| 8,787,130 B1 | 7/2014 | Yuan et al. |
| 8,791,391 B2 | 7/2014 | Bourez |
| 8,795,765 B2 | 8/2014 | Koike et al. |
| 8,795,790 B2 | 8/2014 | Sonobe et al. |
| 8,795,857 B2 | 8/2014 | Ayama et al. |
| 8,800,322 B1 | 8/2014 | Chan et al. |
| 8,811,129 B1 | 8/2014 | Yuan et al. |
| 8,817,410 B1 | 8/2014 | Moser et al. |
| 2002/0041980 A1 | 4/2002 | Suzuki et al. |
| 2002/0060883 A1 | 5/2002 | Suzuki |
| 2003/0022024 A1 | 1/2003 | Wachenschwanz |
| 2003/0053238 A1 | 3/2003 | Kai et al. |
| 2004/0022387 A1 | 2/2004 | Weikle |
| 2004/0110035 A1 | 6/2004 | Shin et al. |
| 2004/0132301 A1 | 7/2004 | Harper et al. |
| 2004/0161638 A1 | 8/2004 | Maeda et al. |
| 2004/0185307 A1 | 9/2004 | Oikawa et al. |
| 2004/0191578 A1 | 9/2004 | Chen et al. |
| 2004/0202793 A1 | 10/2004 | Harper et al. |
| 2004/0202865 A1 | 10/2004 | Homola et al. |
| 2004/0209123 A1 | 10/2004 | Bajorek et al. |
| 2004/0209470 A1 | 10/2004 | Bajorek |
| 2005/0036223 A1 | 2/2005 | Wachenschwanz et al. |
| 2005/0142990 A1 | 6/2005 | Homola |
| 2005/0150862 A1 | 7/2005 | Harper et al. |
| 2005/0151282 A1 | 7/2005 | Harper et al. |
| 2005/0151283 A1 | 7/2005 | Bajorek et al. |
| 2005/0151300 A1 | 7/2005 | Harper et al. |
| 2005/0155554 A1 | 7/2005 | Saito |
| 2005/0167867 A1 | 8/2005 | Bajorek et al. |
| 2005/0263401 A1 | 12/2005 | Olsen et al. |
| 2006/0147758 A1 | 7/2006 | Jung et al. |
| 2006/0181697 A1 | 8/2006 | Treves et al. |
| 2006/0188743 A1 | 8/2006 | Seki et al. |
| 2006/0207890 A1 | 9/2006 | Staud |
| 2006/0222903 A1 | 10/2006 | Ichihara et al. |
| 2007/0026262 A1 | 2/2007 | Maeda |
| 2007/0070549 A1 | 3/2007 | Suzuki et al. |
| 2007/0072011 A1 | 3/2007 | Li et al. |
| 2007/0187227 A1 | 8/2007 | Marinero |
| 2007/0245909 A1 | 10/2007 | Homola |
| 2007/0292720 A1 | 12/2007 | Suess |
| 2007/0292721 A1* | 12/2007 | Berger ............... G11B 5/66 428/828.1 |
| 2008/0037171 A1 | 2/2008 | Mukherjee et al. |
| 2008/0075845 A1 | 3/2008 | Sonobe et al. |
| 2008/0093760 A1 | 4/2008 | Harper et al. |
| 2008/0311430 A1 | 12/2008 | Chen et al. |
| 2009/0117408 A1 | 5/2009 | Umezawa et al. |
| 2009/0136784 A1 | 5/2009 | Suzuki et al. |
| 2009/0169922 A1 | 7/2009 | Ishiyama |
| 2009/0191331 A1 | 7/2009 | Umezawa et al. |
| 2009/0202866 A1 | 8/2009 | Kim et al. |
| 2009/0226762 A1 | 9/2009 | Hellwig et al. |
| 2009/0311557 A1 | 12/2009 | Onoue et al. |
| 2010/0143752 A1 | 6/2010 | Ishibashi et al. |
| 2010/0190035 A1 | 7/2010 | Sonobe et al. |
| 2010/0196619 A1 | 8/2010 | Ishiyama |
| 2010/0196740 A1 | 8/2010 | Ayama et al. |
| 2010/0209601 A1 | 8/2010 | Shimokawa et al. |
| 2010/0215992 A1 | 8/2010 | Horikawa et al. |
| 2010/0232065 A1 | 9/2010 | Suzuki et al. |
| 2010/0247965 A1 | 9/2010 | Onoue |
| 2010/0261039 A1 | 10/2010 | Itoh et al. |
| 2010/0276272 A1 | 11/2010 | Zheng et al. |
| 2010/0279151 A1 | 11/2010 | Sakamoto et al. |
| 2010/0300884 A1 | 12/2010 | Homola et al. |
| 2010/0304186 A1 | 12/2010 | Shimokawa |
| 2011/0097603 A1 | 4/2011 | Onoue |
| 2011/0097604 A1 | 4/2011 | Onoue |
| 2011/0171495 A1 | 7/2011 | Tachibana et al. |
| 2011/0206947 A1 | 8/2011 | Tachibana et al. |
| 2011/0212346 A1 | 9/2011 | Onoue et al. |

(56) References Cited

U.S. PATENT DOCUMENTS

| | | |
|---|---|---|
| 2011/0223446 A1 | 9/2011 | Onoue et al. |
| 2011/0244119 A1 | 10/2011 | Umezawa et al. |
| 2011/0299194 A1 | 12/2011 | Aniya et al. |
| 2011/0311841 A1 | 12/2011 | Saito et al. |
| 2012/0028078 A1 | 2/2012 | Li et al. |
| 2012/0069466 A1 | 3/2012 | Okamoto et al. |
| 2012/0070692 A1 | 3/2012 | Sato et al. |
| 2012/0077060 A1 | 3/2012 | Ozawa |
| 2012/0127599 A1 | 5/2012 | Shimokawa et al. |
| 2012/0127601 A1 | 5/2012 | Suzuki et al. |
| 2012/0129009 A1 | 5/2012 | Sato et al. |
| 2012/0140359 A1 | 6/2012 | Tachibana |
| 2012/0141833 A1 | 6/2012 | Umezawa et al. |
| 2012/0141835 A1 | 6/2012 | Sakamoto |
| 2012/0148875 A1 | 6/2012 | Hamakubo et al. |
| 2012/0156523 A1 | 6/2012 | Seki et al. |
| 2012/0164488 A1 | 6/2012 | Shin et al. |
| 2012/0170152 A1 | 7/2012 | Sonobe et al. |
| 2012/0171369 A1 | 7/2012 | Koike et al. |
| 2012/0175243 A1 | 7/2012 | Fukuura et al. |
| 2012/0189872 A1 | 7/2012 | Umezawa et al. |
| 2012/0196049 A1 | 8/2012 | Azuma et al. |
| 2012/0207919 A1 | 8/2012 | Sakamoto et al. |
| 2012/0214021 A1 | 8/2012 | Sayama et al. |
| 2012/0225217 A1 | 9/2012 | Itoh et al. |
| 2012/0251842 A1 | 10/2012 | Yuan et al. |
| 2012/0251846 A1 | 10/2012 | Desai et al. |
| 2012/0276417 A1 | 11/2012 | Shimokawa et al. |
| 2012/0308722 A1 | 12/2012 | Suzuki et al. |
| 2013/0040167 A1 | 2/2013 | Alagarsamy et al. |
| 2013/0071694 A1 | 3/2013 | Srinivasan et al. |
| 2013/0165029 A1 | 6/2013 | Sun et al. |
| 2013/0175252 A1 | 7/2013 | Bourez |
| 2013/0216865 A1 | 8/2013 | Yasumori et al. |
| 2013/0230647 A1 | 9/2013 | Onoue et al. |
| 2013/0314815 A1 | 11/2013 | Yuan et al. |
| 2014/0011054 A1 | 1/2014 | Suzuki |
| 2014/0044992 A1 | 2/2014 | Onoue |
| 2014/0050843 A1 | 2/2014 | Yi et al. |
| 2014/0151360 A1 | 6/2014 | Gregory et al. |
| 2014/0234666 A1 | 8/2014 | Knigge et al. |

OTHER PUBLICATIONS

Hu, et al. "Exchange Coupling Assisted FePtC Perpendicular Recording Media", App.Phys.Let.93, 072504 (2008), 3 pages.

J.S. Chen, et al., "High coercive L10 FePt—C (001) nanocomopsite films with small grain size for perpendicular recording media", JAP, 103, 07F517 (2008).

Li Zhang et al., "L10-ordered high coercivity (FePt) Ag—C granular thin films for perpendicular recording", JMMM 322 (2010) 2658-2664.

Dieter Weller, et al., "High Ku Materials Approach to 100 Gbits/in2", IEEE Transactions on Magnetics, vol. 36, No. 1, Jan. 2000, pp. 10-15.

Office Action dated Oct. 16, 2012 from U.S. Appl. No. 12/860,616, 19 pages.

Notice of Allowance dated Mar. 5, 2013 from U.S. Appl. No. 12/860,616, 9 pages.

Hua Yuan, et al., U.S. Appl. No. 12/860,616, filed Aug. 20, 2010, 27 pages.

Antony Ajan, et al., U.S. Appl. No. 13/436,596, filed Mar. 31, 2012, 13 pages.

Notice of Allowance dated Jun. 23, 2014 from U.S. Appl. No. 12/860,616, 16 pages.

* cited by examiner

SINGLE LAYER SMALL GRAIN SIZE FEPT:C FILM FOR HEAT ASSISTED MAGNETIC RECORDING MEDIA

REFERENCE TO RELATED APPLICATIONS

This application is a divisional of U.S. patent application Ser. No. 12/860,616, filed Aug. 20, 2010, the content of which is incorporated herein by reference in its entirety.

TECHNICAL FIELD

This invention relates to the field of disk drives and more specifically, to heat assisted magnetic recording media for disk drives.

BACKGROUND

For all types of substrates, magnetic recording media has begun to incorporate perpendicular magnetic recording (PMR) technology in an effort to increase areal density and is now working toward densities of 800 Gbits/in$^2$. Generally, PMR media may be partitioned into two primary functional regions: a soft magnetic underlayer (SUL) and a magnetic recording layer(s) (RL). FIG. 1 illustrates portions of a conventional perpendicular magnetic recording disk drive system having a recording head 101 including a trailing write pole 102 and a leading return (opposing) pole 103 magnetically coupled to the write pole 102. An electrically conductive magnetizing coil 104 surrounds the yoke of the write pole 102. The bottom of the opposing pole 103 has a surface area greatly exceeding the surface area of the tip of the write pole 102. As the magnetic recording disk 105 is rotated past the recording head 101, current is passed through the coil 104 to create magnetic flux within the write pole 102. The magnetic flux passes from the write pole 102, through the disk 105, and across to the opposing pole 103 to record in the PMR layer 150. The SUL 110 enables the magnetic flux from the trailing write pole 102 to return to the leading opposing pole 103 with low impedance.

Typically, higher areal densities are typically achieved with well-isolated smaller grains in the PMR layer. A higher magnetocrystalline anisotropy constant ($K_u$) is typically required to resist the demagnetization effects of the perpendicular geometry and to keep the smaller grains thermally stable to reduce media noise.

With the advent of heat-assisted magnetic recording (HAMR) media, areal densities of 900 Gbits/in$^2$ and higher using PMR technology has been realized. This is because HAMR media comprises of a magnetic compound, such as an FePT alloy, that has a higher magnetic stability than PMR technology using non-HAMR media (e.g., CoPt). However, because the HAMR media comprises of such higher-stability magnetic compounds, HAMR media requires that heat be applied to it before changes its magnetic orientation can be changed. Typically, when PMR technology magnetically records data to HAMR media, it first uses a heating element, such as a laser, to increase the temperature of the recording location on the media, in order to lower the location's high magnetic anisotropy constant ($K_u$) sufficiently to allow a change to its magnetic orientation (i.e., record data).

FIG. 2 illustrates a cross-sectional view of an exemplary heat-assisted magnetic recording (HAMR) media comprising a hard magnetic recording layer 205, a soft magnetic underlayer (SUL) 210, a heatsink layer and non-magnetic interlayer 215 between the hard magnetic recording layer 205 and soft magnetic underlayer 210, and a bottom substrate 225. The hard magnetic recording layer 205 illustrated is a L1$_0$ layer made of iron platinum (FePt), a magnetic compound known to have a high magnetic anisotropy constant ($K_u$). Other suitable compounds for the hard magnetic layer include iron platinum alloys (FePtX), such as FePtCu, FePtAu, FePtAg, and FePtNi. It has been discovered that certain dopants, such as carbon (resulting in FePtX:C), when added to a iron platinum alloy of a hard magnetic recording layer, results in small grain size, granular microstructure, high magnetocrystalline anisotropy, high coercivity, good texture and ordering, and lower ordering temperature, all of which are desirable properties for HAMR media.

Unfortunately, in order to provide strong magnetic signal for the reader sensor detection and high signal-to-noise ratio (SNR) in the recording process, HAMR media require a relatively thick hard magnetic recording layer, preferably a thickness above 5 nm. This is particularly problematic for HAMR media that utilize carbon doped iron platinum alloy (FePtX:C) for its hard magnetic layer, as typically a FePtX:C hard magnetic layer having a thicknesses beyond 5-6 nm results in the formation of two or more layers of FePtX:C. This is clearly shown in FIG. 3A-3C, where FIG. 3A shows a FePt:C recording layer (303) of ~4.6 nm forming a single layer, where FIG. 3B shows a FePt:C recording layer (306) of ~7 nm starting to form a second layer, and where FIG. 3C shows a FePt:C recording layer (309) of ~9.8 nm forming two layers (312 and 315). When more than a single layer forms within the hard magnetic layer, properties required of the HAMR, such as high coercivity, begin to degrade. For example, FIG. 4 illustrates how coercivity for the examples provided in FIGS. 3A-3C begins to degrade as the thickness of the FePt:C recording layer increases.

BRIEF DESCRIPTION OF THE DRAWINGS

The present invention is illustrated by way of example, and not limitation, in the figures of the accompanying drawings in which.

DETAILED DESCRIPTION

In the following description, numerous specific details are set forth, such as examples of specific layer compositions and properties, to provide a thorough understanding of various embodiment of the present invention. It will be apparent however, to one skilled in the art that these specific details need not be employed to practice various embodiments of the present invention. In other instances, well known components or methods have not been described in detail to avoid unnecessarily obscuring various embodiments of the present invention.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Embodiments of the present invention include a recording medium comprising a hard magnetic recording layer disposed above a soft magnetic underlayer, where the hard magnetic recording layer comprises a plurality of carbon doped FePt or FePt alloy (FePtX) columnar grains, and the plurality of carbon doped FePt alloy columnar grains comprise a carbon gradient along the thickness of the hard magnetic recording layer. For some such embodiments, which include either FePt doped with a carbon gradient or FePt alloys (FePtX) doped with a carbon gradient, the hard magnetic recording layer can achieve thicknesses above 5 nm while maintaining a single layer.

Figure 1:
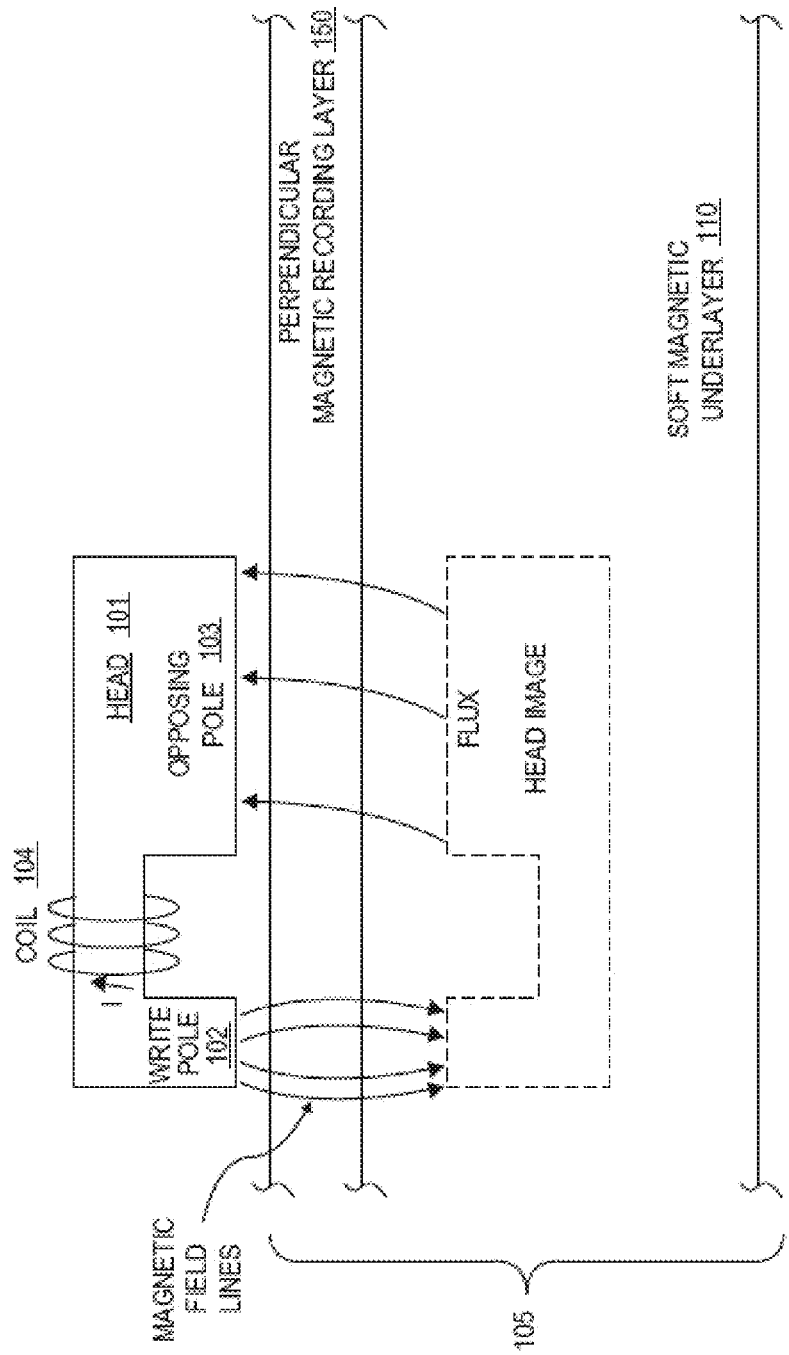
FIG. 1 (prior art) illustrates a conventional perpendicular recording disk drive system.
Figure 2:
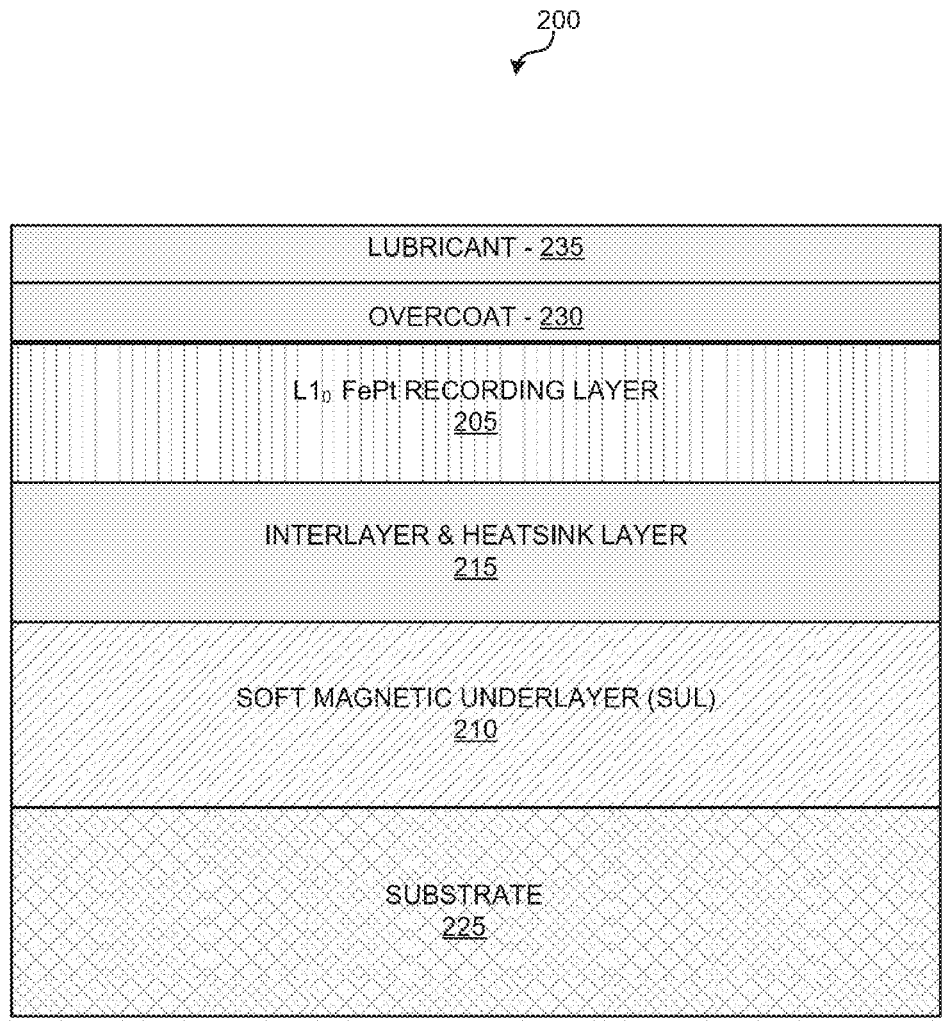
FIG. 2 (prior art) illustrates a cross-sectional view of an exemplary heat-assisted magnetic recording (HAMR) media.
Figure 3A:
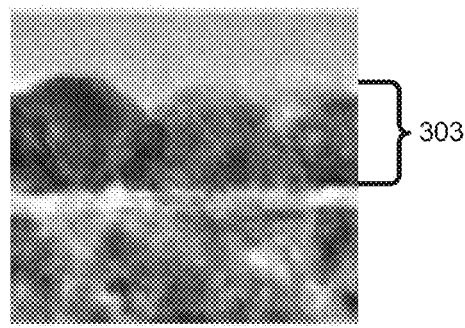
FIGS. 3A-3C provides images depicting the cross-sections of example heat-assisted magnetic recording (HAMR) media, each media having a FePt:C magnetic recording layer of different thickness.
Figure 3B:
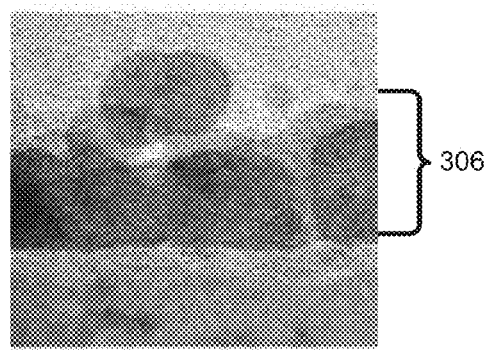
Figure 3C:
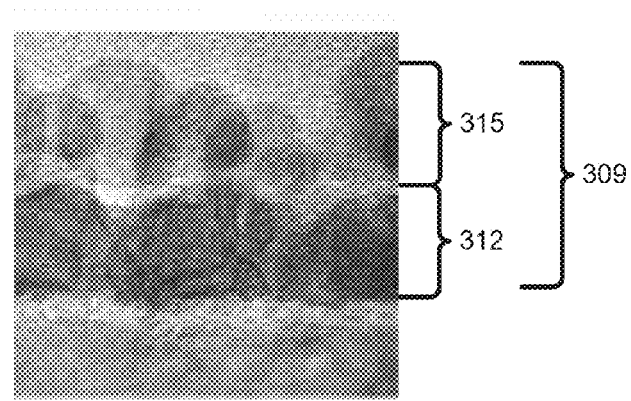
Figure 4:
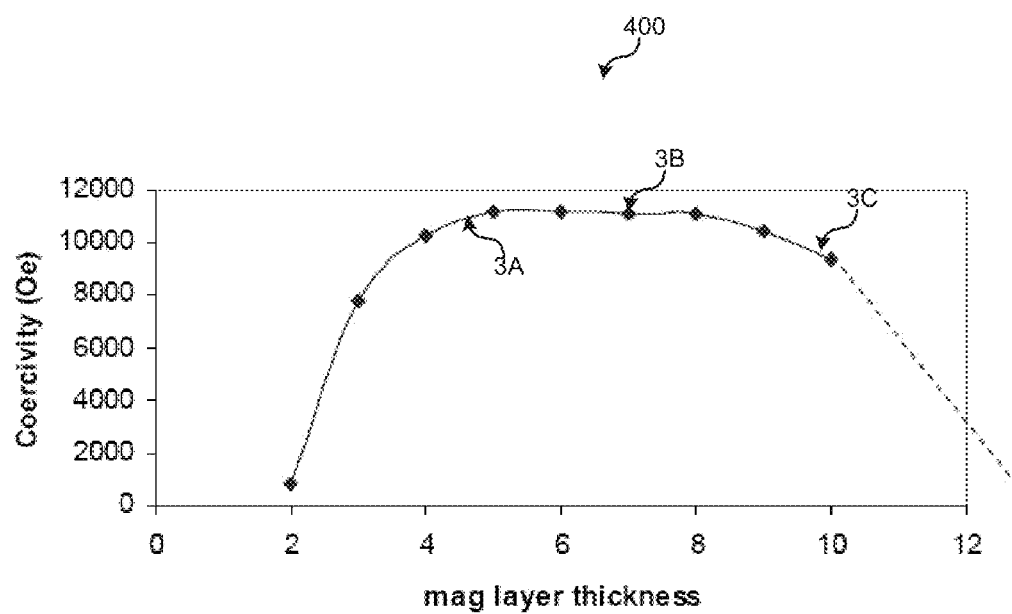
FIG. 4 illustrates the correlation between coercivity and thickness of a FePt:C magnetic recording layer within heat-assisted magnetic recording (HAMR) media.
Figure 5:
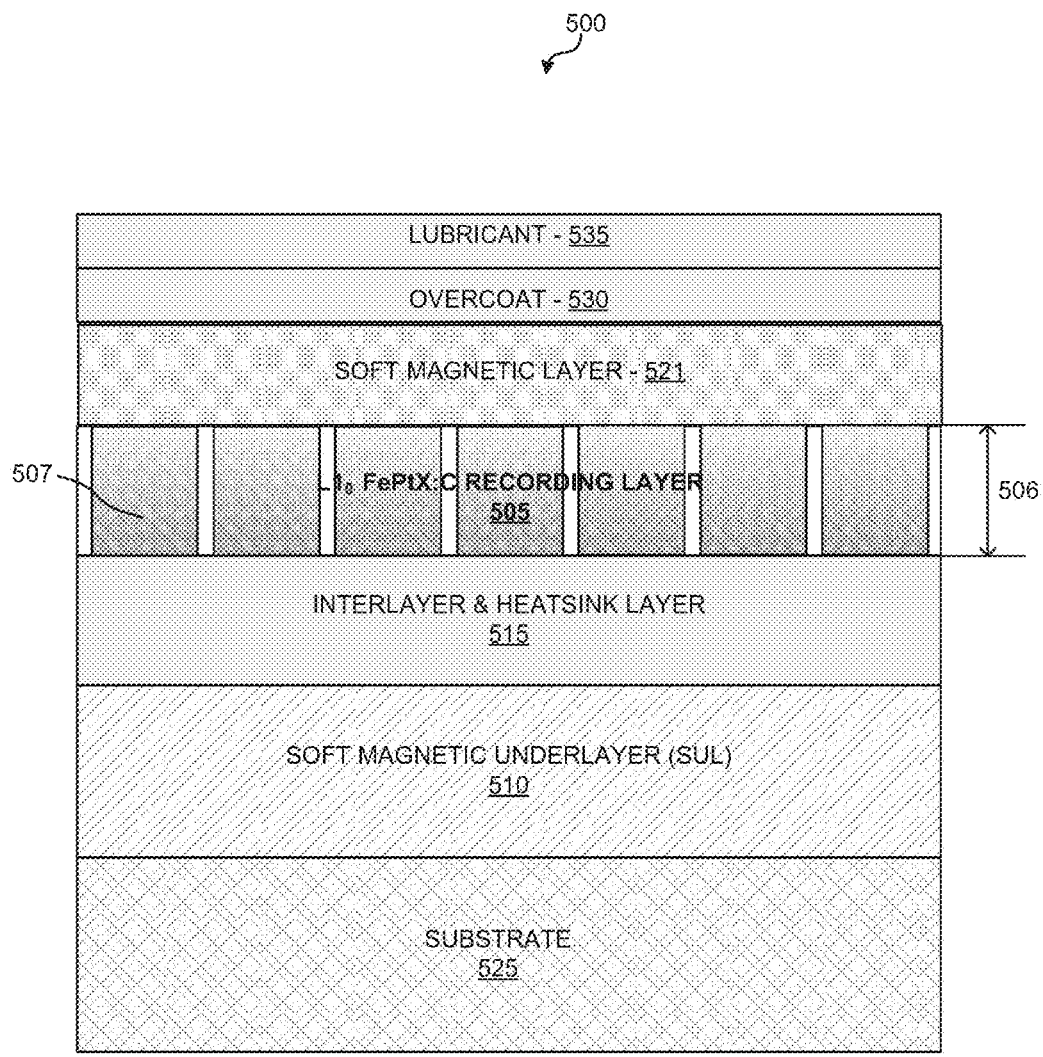
FIG. 5 illustrates a cross-sectional view of a heat-assisted magnetic recording (HAMR) media comprising a FePtX:C recording layer in accordance with an embodiment of the present invention.

FIG. 5 illustrates a cross-sectional depiction of an exemplary embodiment of a HARM media structure 500 comprising a $L1_0$ FePtX:C hard magnetic recording layer 505, having a thickness 506 greater than 5 nm, a granular structure (i.e., columns of FePtX:C 507), small grain size, good uniformity, high coercivity, high magnetic flux and good atomic ordering. Suitable materials X for the FePtX:C alloy of the hard magnetic recording layer 505 may include Ag, Au, B, Cu, Ir, Nb, Ni, Ti, W, or Zr.

As illustrated by their shading, the FePtX:C columns 507 of the recording layer 505 comprise a carbon (C) gradient along the thickness 506 of the entire hard magnetic layer 505. In some embodiments, the such a graded columns are created by two or more multiple layers (N>2) of FePtX:C films with varying carbon (C) content in each layer. For example, a gradient may be created using a first layer of FePtX:C film having a carbon (C) content of 40% (i.e., FePtX:C40) disposed over the interlayer and heatsink layer 515, and a second layer of FePtX:C film having a carbon (C) content of 20% (i.e., FePtX:C20) disposed over the first layer of FePtX:C film. It would be well understood by one skilled in the art that layers of FePt:C films having different carbon (C) may also be used to create the hard magnetic recording layer with a carbon gradient, and that FePt and FePtX film layers having carbon content different from those discussed here may also be used.

Also depicted is a substrate 525, that may be, for example, a glass, a metal, and/or a metal alloy material. In a particular embodiment, the substrate 525 is disk-shaped or annular. Glass substrates that may be used include, for example, a silica-containing glass such as borosilicate glass and aluminosilicate glass. Metal and metal alloy substrates that may be used include, for example, aluminum (Al), tantalum (Ta), and aluminum magnesium (AlMg) substrates. In an alternative embodiment, other substrate materials such as polymers and ceramics may be used.

The soft magnetic underlayer (SUL) 510 is disposed over the substrate 525. Generally, the SUL 510 may include any materials known in the art. The SUL 510 itself may be a laminate or multilayer stack of a plurality of soft magnetic layers separated by nonmagnetic or antiferromagnetic films. In one exemplary embodiment, the SUL 510 includes a synthetic antiferromagnet (SAF) structure comprising two amorphous soft ferromagnetic layers (e.g., CoTaZr or CoFeTaZr, etc.) antiferromagnetically coupled with one another across a spacer layer (e.g. ruthenium (Ru)) there-between. The thickness of the SUL 510 will generally be in the range of 5 nm to 60 nm.

Disposed over the soft magnetic underlayer (SUL) 510 is an interlayer and a heatsink layer 515. The heatsink layer 515 specifically facilitates heat transfer for the HAMR media. The heatsink layer may also be useful in alternative embodiments in accordance with the present invention, including thermally assisted magnetic recording (TAMR) or optically assisted magnetic recording (OAMR)). Although the illustrated example embodiment depicts the heatsink layer 515 is disposed between the SUL 510 and the hard magnetic recording layer 505, it should be appreciated the heatsink layer 515 may alternatively be disposed between the SUL 510 and the substrate 525. Generally, regardless of the position within the media structure 500, the heatsink layer 515 is usually a metal (e.g. Cu) or other heat conductive material. In the exemplary embodiment, the heatsink layer 525 may have a thickness between 30 nm and 100 nm.

Although the illustrated embodiment depicts the heatsink layer 515 is disposed between the SUL 510 and the hard magnetic recording layer 505, it should be appreciated the heatsink layer 515 may alternatively be disposed between the SUL 510 and the substrate 525. Generally, regardless of the position within the media structure, the heatsink layer 515 is a metal or other heat conductive material. In the exemplary embodiment, the heatsink layer 515 may be made of copper (Cu) and have a thickness between 30 nm and 100 nm.

Disposed over the hard magnetic recording layer 505 are a soft magnetic layer 521, an overcoat 530, and a lubricant 535. The soft magnetic layer 521 is disposed over the hard magnetic recording layer 505, and may comprise a CoFe or CoCr based soft magnetic alloy. This soft magnetic may contain: Al, B, C, Cr, Cu, N, Nb, Ni, Re, Ru, Si, Ta and/or Zr.

Overcoat 530 is formed on top of the soft magnetic recording layer 521 to meet tribological requirements such as contact-start-stop (CSS) performance and corrosion protection. Materials usually utilized for the overcoat layer 530 include carbon-based materials, such as hydrogenated or nitrogenated carbon. A lubricant 535 is placed on top of the overcoat layer 530 to further improve tribological performance. Exemplary lubricants include a perfluoropolyether or phosphazene lubricant or a composite thereof.

Figure 6:
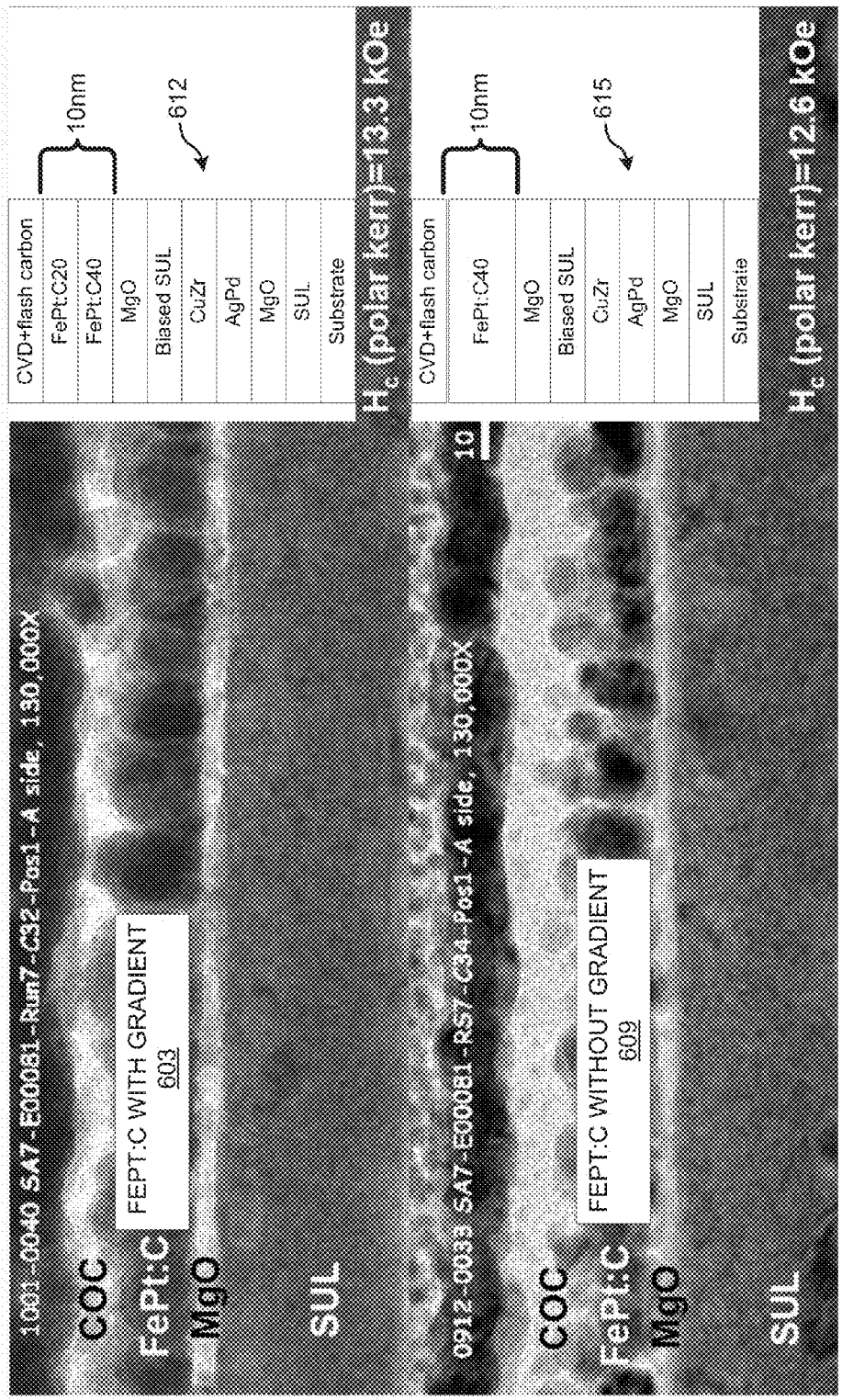
FIG. 6 provides images depicting the cross-sections of two example heat-assisted magnetic recording (HAMR) media, each media having a FePt:C recording layer of the same thickness, but where one media has a FePt:C recording layer in accordance with an embodiment of the present invention.

FIG. 6 provides a transmission electron microscope (TEM) image 603 of the cross-section of a heat-assisted magnetic recording (HAMR) media 612 in accordance with one embodiment of the invention, and a transmission electron microscope (TEM) image 609 of the cross-section of a heat-assisted magnetic recording (HAMR) media 615 in accordance with conventional embodiments. As illustrated, HAMR media 612 comprises of several different layers described above, including a hard magnetic recording layer of 10 nm, comprising of a layer of FePt:C40 and a layer of FePt:C20, thereby resulting in a gradient of carbon content along the thickness of the hard magnetic recording layer. TEM image 603 depicts a single layer of FePt:C forming, despite the thickness of the hard magnetic recording layer being larger than 5 nm.

On the other hand, HAMR media 615 comprises of several different layers described above, including a hard magnetic recording layer of 10 nm, comprising a singe layer of FePt:C40. TEM image 609 depicts a two layers of FePt:C forming, due to the thickness of the hard magnetic recording layer being larger than 5 nm.

Figure 7:
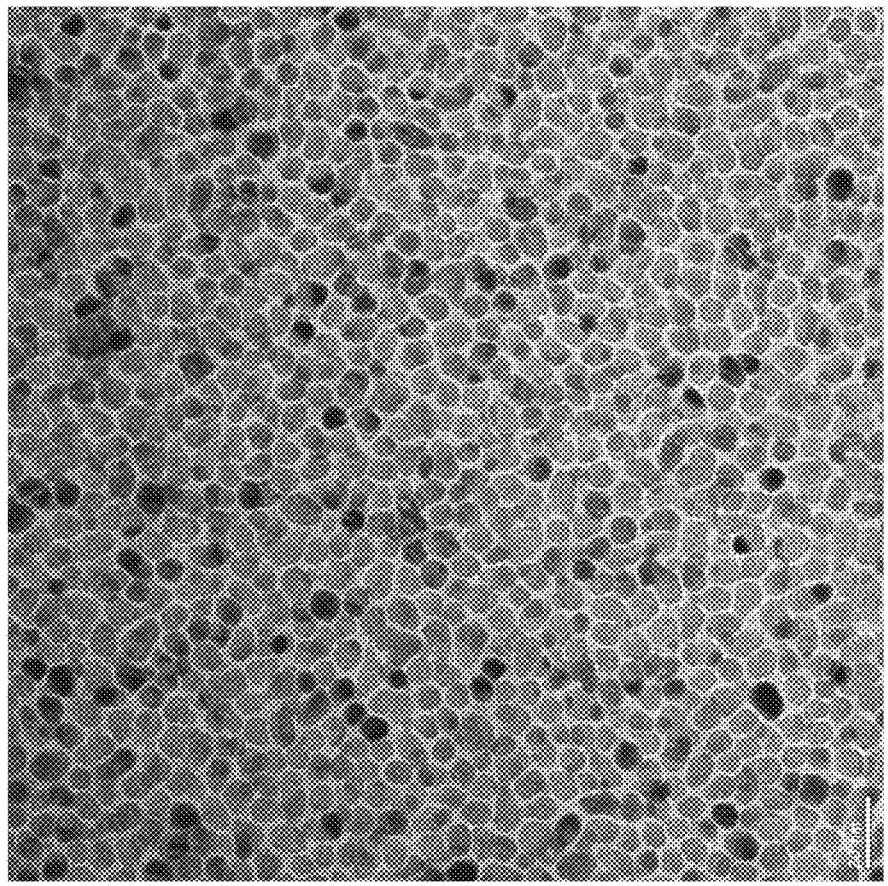
FIG. 7 provides images depicting the plane view of a heat-assisted magnetic recording (HAMR) media having a FePt:C recording layer in accordance with an embodiment of the present invention.

FIG. 7 provides transmission electronic microscope (TEM) images depicting the plane view of a heat-assisted magnetic recording (HAMR) media having a FePt recording layer having a carbon gradient in accordance with an embodiment of the present invention. Specifically, the TEM images provided depict the good granular microstructure that results from the FePt recording layer having a carbon gradient.

Figure 8:
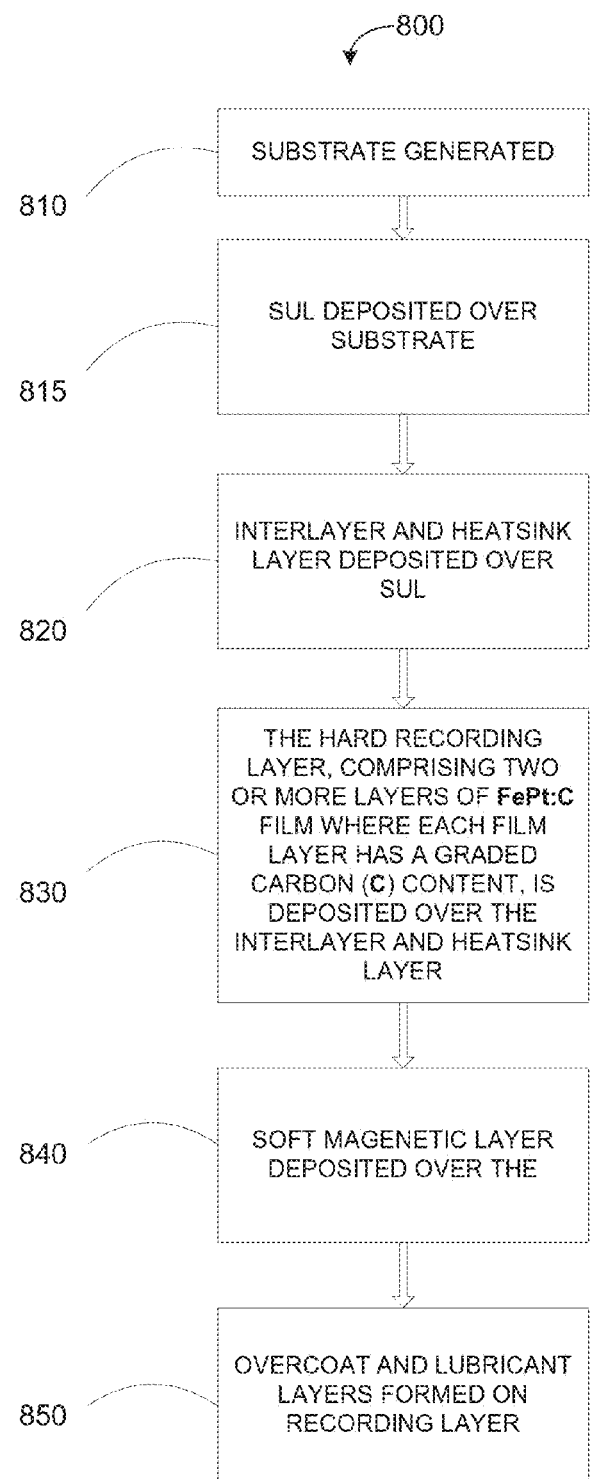
FIG. 8 illustrates a method of manufacturing a heat-assisted magnetic recording (HAMR) media, in accordance with an embodiment of the present invention.

FIG. 8 illustrates one embodiment of a method 800 of manufacturing a heat assisted magnetic recording disk having a FePtX:C-based PMR media structure such as that described elsewhere herein in reference to FIG. 5. A substrate 525 is generated, or otherwise provided, at operation 810. The generation of a substrate for a magnetic recording disk is per se known in the art; accordingly a detailed discussion is not provided. At operation 815, the SUL 510 including any of the materials described elsewhere herein, such as a CoFe or CoCr based soft magnetic alloy, is deposited over the substrate 525. Any conventional deposition method configured for the formation of the SUL 510 may be utilized, such as sputter deposition (i.e., physical vapor deposition (PVD)).

At operation 820 the interlayer and heatsink layer 515 deposited over the SUL 510 to facilitate heat-assisted perpendicular magnetic recording.

At operation 830, the hard recording layer, comprising two or more layers (N>2) of FePtX:C film, where each film layer has a graded carbon (C) content, is deposited over the interlayer and heatsink layer 515. As discussed above, materials X that can be used in utilized in the FePtX alloy, such as, Ag, Au, B, Cu, Ir, Nb, Ni, Ti, W, or Zr, for example, to stabilize the phase or tune the magnetic properties of the hard magnetic recording layer 505. In some embodiments, the two or more layers of FePtX:C may be deposited using two or more chambers containing FePtX:C material of differing carbon content. For example, to deposit one layer of FePtX:C40 and one layer of FePtX:C20 for the hard magnetic recording layer, one chamber would contain FePtX:C40 material, while another would contain FePtX:C20 material. In some such embodiments, the FePtX:C material is deposited at a pressure between 2 mTorr and 100 mTorr.

At operation 840, a soft magnetic layer 521 is deposited over the hard magnetic recording layer 505. In some embodiments, the soft magnetic layer 521 and the hard magnetic layer 505 may form a graded Hk structure, an exchange coupled composite (ECC) structure or a synthetic antiferromagnetically coupled (SAF) structure. The soft magnetic alloy of the soft magnetic layer 521 may be a FePtX or CoPtX alloy, where X may be Ag, Au, B, Cu, Ir, Nb, Ni, Ti, W, or Zr. In addition, the soft magnetic alloy may also be a disordered structure, having a low anisotropy field and a curie temperature.

Next, in operation 850, an overcoat 530 layer and a lubricant layer 535 are formed over the hard magnetic recording layer 505. Overcoat 530 may be formed on top of the soft magnetic recording layer 521 to meet tribological requirements such as contact-start-stop (CSS) performance and corrosion protection. As discussed above, predominant materials for the overcoat layer 530 are carbon-based materials, such as hydrogenated or nitrogenated carbon. A lubricant 535 may be placed on top of the overcoat layer 530, by dip coating, spin coating, etc., to further improve tribological performance. Example lubricants include a perfluoropolyether or phosphazene lubricant or a composite thereof.

For deposition of each FePtX:C layer of the recording layer 505, a variety of methods known in the art, for example, electroless plating, sputtering (e.g., static or in-line), chemical vapor deposition (CVD), ion-beam deposition (IBD), etc. may be utilized. For example a static sputter systems may be utilized, such as those available from manufacturers such as Intevac Inc. of Santa Clara, Calif. and Canon-Anelva Corp. of Japan. With in-line sputtering systems, disk substrates are loaded on a pallet that passes through a series of deposition chambers the deposit films successively on substrates. In-line sputtering systems are available from manufacturers such as Ulvac Corp. of Japan.

Figure 9:
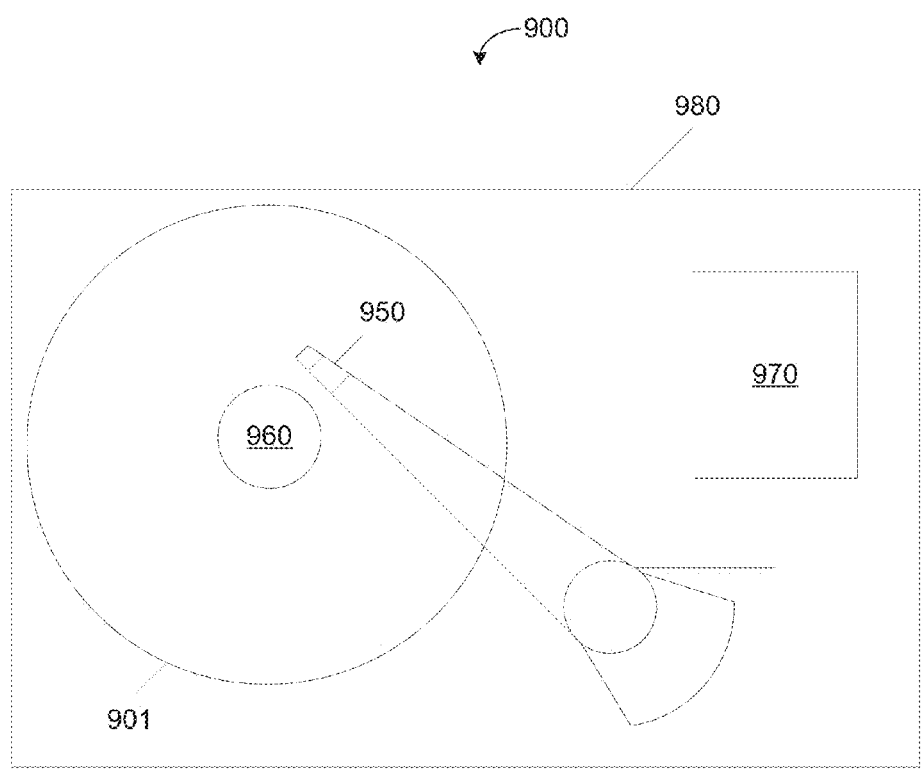
FIG. 9 illustrates a disk drive including a heat-assisted magnetic recording (HAMR) recording disk, in accordance with an embodiment of the present invention.

FIG. 9 illustrates a disk drive 900 having disk 901. Disk drive 900 may include one or more disks 900 to store data. Disk 901 resides on a spindle assembly 960 that is mounted to drive housing 980. Data may be stored along tracks in the magnetic recording layer of disk 901. The reading and writing of data is accomplished with head 950 that has both read and write elements. The write element is used to alter the properties of the perpendicular magnetic recording layer of disk 901. In one embodiment, head 950 may have magneto-resistive (MR), or giant magneto-resistive (GMR) elements. In an alternative embodiment, head 950 may be another type of head, for example, an inductive read/write head or a Hall effect head. In some embodiments, the disk 900 has the media structure as depicted in FIG. 5, and the disk drive 900 is a heat assisted magnetic recording (HAMR) drive and incorporate components of a laser source, a waveguide, and a near-field transducer (not depicted). Techniques in generating and focusing a laser beam are known in the art, and thus, are not described in particular detail. A spindle motor (not shown) rotates spindle assembly 960 and, thereby, disk 901 to position head 950 at a particular location along a desired disk track. The position of head 950 relative to disk 901 may be controlled by position control circuitry 970. The use of disk 901 fabricated in the manners discussed above may improve the performance of the perpendicular magnetic recording layer of disk 901 by providing a higher magnetic anisotropy from an $L1_0$-ordered recording layer. The use of disk 901 fabricated in the manners discussed above may also enable the use of $L1_0$-structured media on non-glass substrates.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. A method of manufacturing a recording medium, comprising:
   forming a soft magnetic underlayer;
   forming a hard magnetic recording layer over the soft magnetic underlayer, wherein forming the hard magnetic record layer comprises:
   depositing a first sub-layer over the soft magnetic underlayer, the first sub-layer comprising a first carbon doped FePt alloy; and
   depositing a second sub-layer over the first sub-layer, the second sub-layer comprising a second carbon doped FePt alloy with a different carbon content by at % than the first carbon doped FePt alloy; and
   forming a soft magnetic layer over the hard magnetic recording layer, the soft magnetic layer comprising a CoFe or CoCr based soft magnetic alloy,
   wherein the hard magnetic recording layer comprises a plurality of carbon doped FePt alloy columnar grains, each of the plurality of carbon doped FePt alloy columnar grains comprising a carbon gradient along a thickness of the hard magnetic recording layer, wherein the different carbon content of the first and second sub-layers results, at least in part, in the carbon gradient.

2. The method of claim 1, wherein the first sub-layer has 40 at. % carbon.

3. The method of claim 2, wherein the second sub-layer has 20 at. % carbon.

4. The method of claim 1, wherein the hard magnetic recording layer is formed through a sputtering process, the sputtering process comprising first and second sputtering operations, wherein the first sputtering operation forms the first sub-layer and wherein the second sputtering operation forms the second sub-layer.

5. The method of claim 4, wherein the first sputtering operation uses a first sputtering chamber containing the first carbon doped FePt alloy for the first sub-layer, and wherein the second sputtering operation uses a second sputtering chamber containing the second carbon doped FePt alloy for the second sub-layer.

6. The method of claim 4, wherein the sputtering process uses a pressure range between 2 mT and 100 mT.

7. The method of claim 1, wherein the carbon gradient is such that carbon content within the hard magnetic recording layer is greater closer to the soft magnetic underlayer.

8. The method of claim 1, wherein the carbon gradient is such that carbon content within the hard magnetic recording layer is greater away from the soft magnetic underlayer.

9. The method of claim 1, wherein the thickness of the hard magnetic recording layer is more than 5 nm.

10. The method of claim 1, wherein the FePt alloy in the carbon doped FePt alloy columnar grains is a FePtX alloy, where X comprises Ag, Au, B, Cu, Ir, Nb, Ni, Ti, W, or Zr.

11. The method of claim 1, wherein the thickness of the plurality of carbon doped FePt alloy columnar grains is more than 5 nm.

* * * * *